United States Patent
Tran et al.

(10) Patent No.: US 6,275,034 B1
(45) Date of Patent: Aug. 14, 2001

(54) MICROMACHINED SEMICONDUCTOR MAGNETIC SENSOR

(75) Inventors: Chau C. Tran, Malden; John A. Geen, Tewskbury; A. Paul Brokaw, Burlington; Geoffrey T. Haigh, Boxford, all of MA (US)

(73) Assignee: Analog Devices Inc., Norwood, MA (US)

( * ) Notice: Subject to any disclaimer, the term of this patent is extended or adjusted under 35 U.S.C. 154(b) by 0 days.

(21) Appl. No.: 09/265,660

(22) Filed: Mar. 10, 1999

Related U.S. Application Data

(63) Continuation-in-part of application No. 09/038,307, filed on Mar. 11, 1998, now abandoned.

(51) Int. Cl.[7] .................. G01R 33/02; G01R 33/028; G01R 27/26; H01L 29/82

(52) U.S. Cl. .................. 324/252; 324/247; 324/259; 324/260; 324/661; 257/415; 257/421

(58) Field of Search .................. 324/244, 247, 324/249, 252, 256, 259, 260, 658, 661, 686; 257/415, 421; 73/514.32

(56) References Cited

U.S. PATENT DOCUMENTS

| | | |
|---|---|---|
| 3,911,738 | 10/1975 | Fischer . |
| 4,680,544 | 7/1987 | Rudolf ............................. 324/259 |

(List continued on next page.)

FOREIGN PATENT DOCUMENTS

| | | |
|---|---|---|
| 0389390 | 9/1990 | (EP) . |
| 0392945 | 10/1990 | (EP) . |
| 0646805 | 4/1995 | (EP) . |
| 0816861 | 1/1998 | (EP) . |
| 2136581 | 9/1984 | (GB) . |

OTHER PUBLICATIONS

...,(http://ITRI.LOYOLA.EDU/mems/c3s2.html.), "Sensor Development in Japan," Sep. 1994.
Edwards, R. Timothy, (http://BACH.ECE.JHE.EDU/~tim/papers/sensor.hmtl.,) "Microfabrication Lab Project Report: A Simple CMOS Pressure Sensor," Dec. 1994.
Baltes, H., Castagnetti, R., Schneider, M., (http://IQE.ETHZ.CH/~fpst/FinalReport/M4/M4P02–2.html.), "LESIT Final Report 1995: Project 4.2.2: Bipolar Magnetic Field Sensors," 1995.
...,(http://WWW.PHYS.TTU.EDU/~peters/sens.html.), "SDC Sensors".
...,(http://WWW.ECE.NEU.EDU/edsnu/zavracky/mfl/programs/soi/soi.html.), "Silicon–on–insulator Research."

*Primary Examiner*—Gerard R. Strecker
(74) *Attorney, Agent, or Firm*—Samuels, Gauthier & Stevens, LLP

(57) ABSTRACT

A semiconductor magnetic field sensor including a substrate; a semiconductor moveable element suspended above the substrate, the moveable element being configured to have a current passed therethrough and to deflect perpendicularly with respect to an applied magnetic field; and at least one fixed semiconductor element arranged adjacent to the moveable element, the moveable element being deflected to or away from the fixed element in response to an applied magnetic field. In an alternative embodiment of the invention, there is provided a semiconductor magnetic field sensor including a substrate; first and second semiconductor moveable beams suspended above the surface of the substrate, the first and second beams being configured to have equal and opposite currents passed therethrough and to deflect perpendicularly with respect to an applied magnetic field; and at least one first and second fixed semiconductor elements arranged adjacent to the first and second beams, respectively, the first and second beams being deflected to or away from the respective first and second fixed elements in response to an applied magnetic field.

24 Claims, 10 Drawing Sheets

U.S. PATENT DOCUMENTS

| | | |
|---|---|---|
| 4,951,510 | 8/1990 | Holm-Kennedy et al. . |
| 5,036,286 | 7/1991 | Holm-Kennedy et al. . |
| 5,083,174 | 1/1992 | Kub . |
| 5,181,156 | 1/1993 | Gutteridge et al. . |
| 5,243,861 | 9/1993 | Kloeck et al. . |
| 5,315,247 | 5/1994 | Kaiser et al. . |
| 5,392,658 | 2/1995 | Okada ............................... 324/259 X |
| 5,540,095 | 7/1996 | Sherman et al. . |
| 5,565,625 | 10/1996 | Howe et al. . |
| 5,659,195 | 8/1997 | Kaiser et al. . |
| 5,659,262 | 8/1997 | Memishian . |
| 5,731,703 | 3/1998 | Bernstein et al. ................ 324/260 X |
| 5,818,227 | 10/1998 | Payne et al. ......................... 324/259 |

MICROMACHINED SEMICONDUCTOR MAGNETIC SENSOR

This application is a continuation-in-part of Ser. No. 09/038,307 filed Mar. 11, 1998, now abandoned.

BACKGROUND OF THE INVENTION

The invention relates to semiconductor magnetic sensors or magnetometers, and more particularly to semiconductor magnetic sensors utilizing micromachined beams as the sensing element.

Magnetic sensors or magnetometers are widely used to sense magnetic fields including the Earth's magnetic field. Such devices typically operate to transform the sensed magnetomotive force to an electrical signal for processing.

Semiconductor magnetic sensors which are sensitive to magnetic fields can be quite useful in military, aviation, maritime, and scientific laboratory applications. Magnetic sensors fabricated with micromachining techniques allow for several desirable features including miniaturization, inexpensive and easily repeated fabrication and high sensitivity.

SUMMARY OF THE INVENTION

It is therefore an object of the invention to provide a semiconductor magnetic sensor which yields precise and sensitive measurements of magnetic fields over a wide range of field strengths.

It is another object of the invention to provide a semiconductor magnetic sensor which accurately measures magnetic fields independent of temperature variations.

It is yet another object of the invention to provide a micromachined semiconductor magnetic sensor which is small and can be batch processed to produce consistent performance from device to device.

Accordingly, in one embodiment of the invention there is provided a device which includes at least one beam through which a current is passed, the beam being deflected perpendicularly with respect to an applied magnetic field and at least one fixed conductive member for sensing the deflection of the beam.

In another aspect of the invention there is provided a magnetic field sensor including a moveable member through which a current is passed, the moveable member being deflected perpendicularly with respect to an applied magnetic field; and at least one fixed conductive member arranged adjacent to the moveable member, the moveable member deflecting to or away from the fixed member.

In another aspect of the invention there is provided a semiconductor magnetic field sensor including a substrate; a semiconductor moveable element suspended above the surface of the substrate, the moveable element being configured to have a current passed therethrough and to deflect perpendicularly with respect to an applied magnetic field; and at least one fixed semiconductor element arranged adjacent to the moveable element, the moveable element being deflected to or away from the fixed element in response to an applied magnetic field.

In an alternative embodiment of the invention, there is provided a semiconductor magnetic field sensor including a substrate; first and second semiconductor moveable beams suspended above the surface of the substrate, the first and second beams being configured to have equal and opposite currents passed therethrough and to deflect perpendicularly with respect to an applied magnetic field; and at least one first and second fixed semiconductor elements arranged adjacent to the first and second beams, respectively, the first and second beams being deflected to or away from the respective first and second fixed elements in response to an applied magnetic field.

DETAILED DESCRIPTION OF THE ILLUSTRATED EMBODIMENTS

Figure 1A:
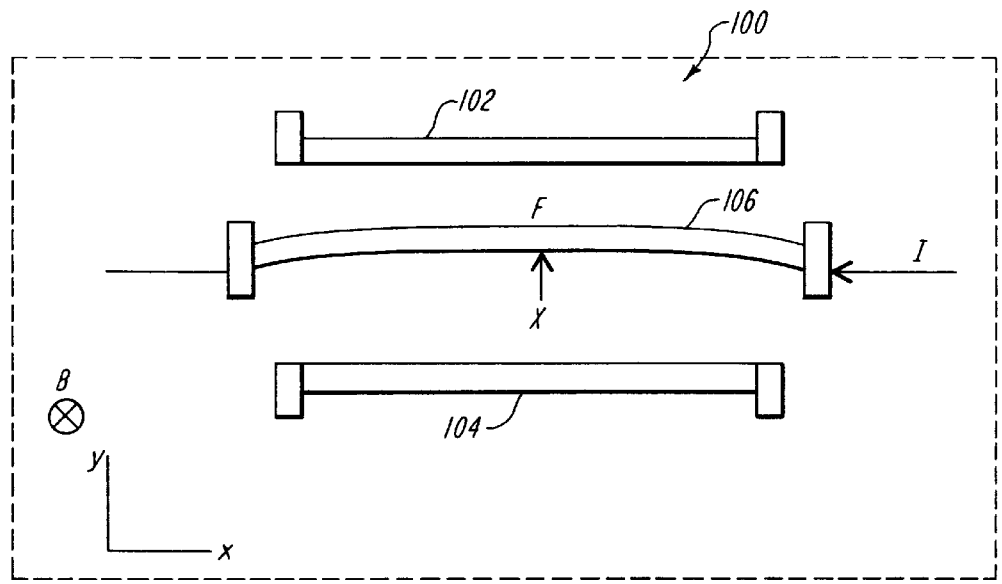
FIGS. 1A and 1B are diagrammatic top plan views of a magnetic sensor beam arrangement 100 in accordance with the invention.
Figure 1B:
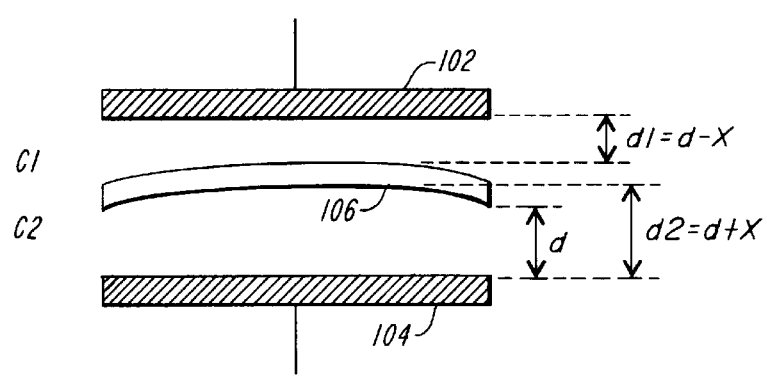

FIGS. 1A and 1B are diagrammatic top plan views of a magnetic sensor beam arrangement 100 in accordance with the invention. The beam arrangement 100 includes first 102 and second 104 fixed beams which are positioned on either side of a moveable filamentary beam 106 through which a current I is passed. The arrangement defines a pair of differential capacitors. As will described in more detail hereinafter, each of the beams is configured from an electrically conductive material, e.g., polysilicon or metal, over a semiconductor substrate which is positioned in the x–y plane. For example, the beam 106 is fabricated from 2 $\mu$m thick polysilicon.

In the situation where a magnetic field B is applied in the z axis (into the page), the associated magnetomotive forces will deflect the beam 106 by a distance X as shown in FIG. 1B. Accordingly, the distances from beam 106 to beam 102 and from beam 106 to beam 104 will be changed, as will the differential capacitances between the beams established by the current in the beam 106.

Thus, the differential capacitances C1 and C2 can be calculated as $C1=\epsilon\{Area/(d-X)\}$ and $C2=\epsilon\{Area/(d+X)\}$, where Area=L*h (L,h: the length and the height of the beam, respectively), d is the distance from the fixed plate to the movable plate, and $\epsilon$ is the permittivity in the air (8.85 pF/m).

The deflection force F is a function of the current I and the flux density B, thus $$F = B \times I \tag{1}$$

where F is measured in Newtons/meter, B is measured in Tesla(Webers/meter$^2$), and I is measured in Amperes.

The force F is applied to the movable beam 106 along its entire length, and the beam will be deflected at its point of maximum deflection by a distance X (at the center of the beam). The formula for the deflection X of a beam tethered at both ends when an uniform force F is applied to it is $$X = n \frac{F \times L^4}{384 \times E \times Im} \tag{2}$$

where, n=1 to 5 depending on the severity of end constraint (constant for fixed-end beams or simple beams), L is the length of the beam (in meters), E is the modulus of elasticity (for polysilicon E=1.6×10$^{11}$ Pa(N/m$^2$)), and Im is the moment of inertia (Im=w$^3$ h/12; with the exemplary beam structure w=h=2 $\mu$m and Im=1.33×10$^{-24}$).

Combining equations (1) and (2), the deflection is:

$$X = n \frac{B \times I \times L^4}{384 \times E \times Im} \tag{3}$$

It will be appreciated that the deflection is a function of the flux density, the current through the beam and more important, the length of the beam (L to the power 4). Thus, X=α×B×I×L$^4$, where α is a constant (α=(n/(384×E×Im)). For the worst case (fixed-end beam, n=1), α=(1/(384× 1.6E11×1.33E-24))=1.22376×10$^{10}$. Therefore, $$X = 1.224 \times 10^{10} \times B \times I \times L^4 \tag{4}$$

Note that the resistance of the beam is very high (approximately 100 ohms/square), therefore, for a long beam, the current I will be quite small. For example, a desirably long, 1 mm beam would have 500 squares and a resistance of 50,000 Ohms. The typical commercial applications for magnetometers have 5 Volt supplies so the maximum available current would be about 0.1 mA.

The deflection X is a) 5 times bigger if the movable beams are supported by folded flexures (folded beams), b) proportional to L$^4$ (if L is doubled, the defection will be 16 times greater), c) proportional to the current I, and d) the first order function of the magnetic field. Using the micromachined beams to measure the magnetic field, the measurements are on the first order of the magnetomotive force.

Figure 2A:
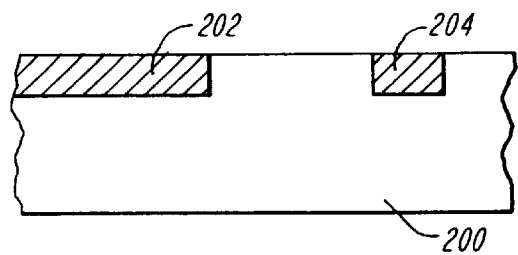
FIGS. 2A–2E illustrate the fabrication sequence of a simplified fundamental beam in accordance with the invention.
Figure 2B:
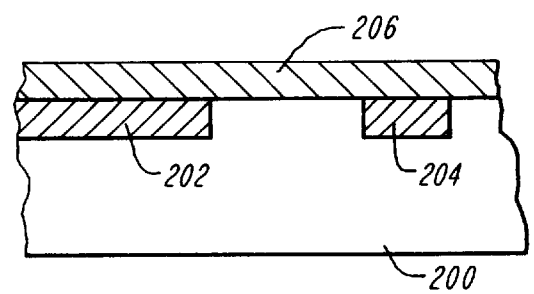
Figure 2C:
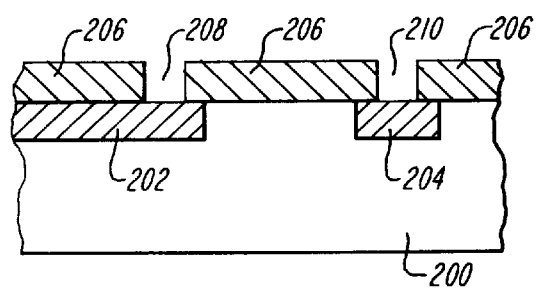
Figure 2D:
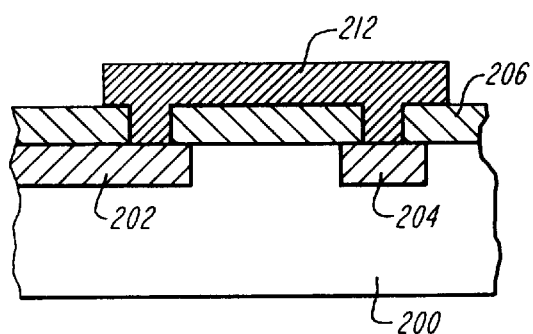
Figure 2E:
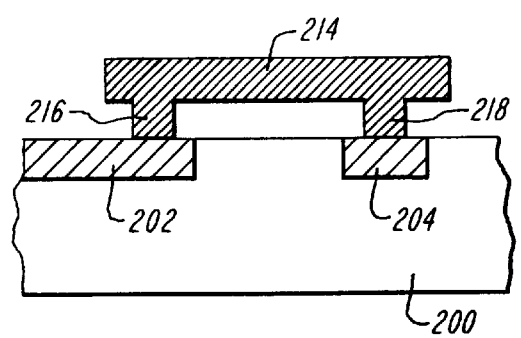

With reference now to FIGS. 2A–2E, the micromachining fabrication sequence of a simplified fundamental beam is described. The fabrication can be done by any conventionally available BiMOS fabrication process. In FIG. 2A, a BiMOS emitter of n+ regions 202, 204 is diffused into a p-type substrate 200. A low temperature oxide (LTO) layer 206 is then deposited on the substrate surface as shown in FIG. 2B. The LTO layer is thereafter masked and etched in a conventional manner to form vias 208, 210 to the n+ regions as shown in FIG. 2C. The etched LTO layer is then subjected to a conventional deposit, mask and etch process to form a layer of polysilicon 212 which contacts the n+ regions as shown in FIG. 2D. Finally, the LTO layer is removed with a conventional etching process so as to result in a self-supporting polysilicon bridge 214 which is anchored and conductively connected to the n+ regions through anchors 216, 218 as shown in FIG. 2E.

Figure 3:
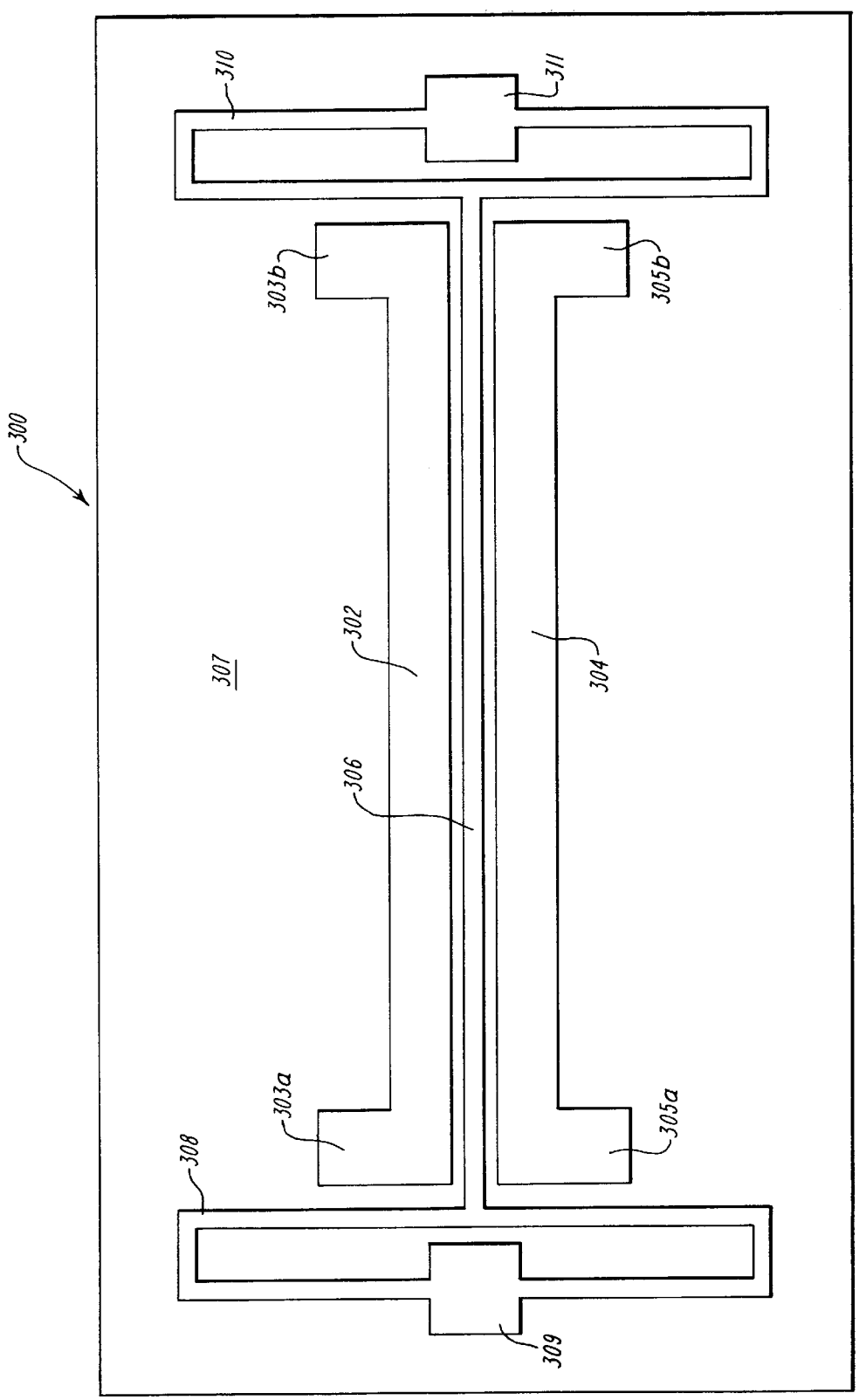
FIG. 3 is a top plan view of a beam arrangement for use in a magnetic sensor of the invention.

FIG. 3 is a top plan view of a micromachined beam arrangement 300 for use in a magnetic sensor of the invention. The arrangement includes fixed beams 302 and 304, and a filamentary moveable beam 306 positioned between the fixed beams. The moveable beam 306 is configured to be 2 $\mu$m wide and any desired length, e.g. 1,000 $\mu$m. The beam 306 is anchored at each end to a semiconductor substrate of an integrated circuit 307 via flexures 308 and 310. The flexures are folded regions of the beam, and can be shaped in rectangular or serpentine shapes. The flexures conduct current from the underlying circuitry via support anchors 309, 311, and relieve tensile stress caused by manufacturing contraction and deflection in use. The length of each flexure is determined by the acceptable nonlinearity error at maximum deflection. The flexures deflect against their natural stiffness to an extent measured by the differential capacitance to the static polysilicon beams 302, 304 spaced by a predetermined gap, e.g. 1.0 $\mu$m. The fixed beams are anchored to the substrate via anchors 303a–b and 305a–b.

In operation, it is preferable to supply the moveable beam 306 with current in alternating opposite directions. Alternatively, a beam arrangement including two distinct parallel moveable beams between separate fixed beams can be used where the current in one of the moveable beams is in a direction opposite to that of the other moveable beam. This arrangement is desired so that in the presence of a transverse magnetic field B, the moveable beams are subject to force uniformly distributed along their lengths and also in opposite directions. This opposition allows the corresponding deflections to be distinguished from deflections caused by acceleration, which would be in the same direction for both beams. The periodic reversal of the currents and synchronous detection of the resulting signal cancels any null bias in the measurement. The static elements are maintained at zero potential as virtual grounds in a differential charge amplifier (i.e. transcapacitance).

Figure 4:
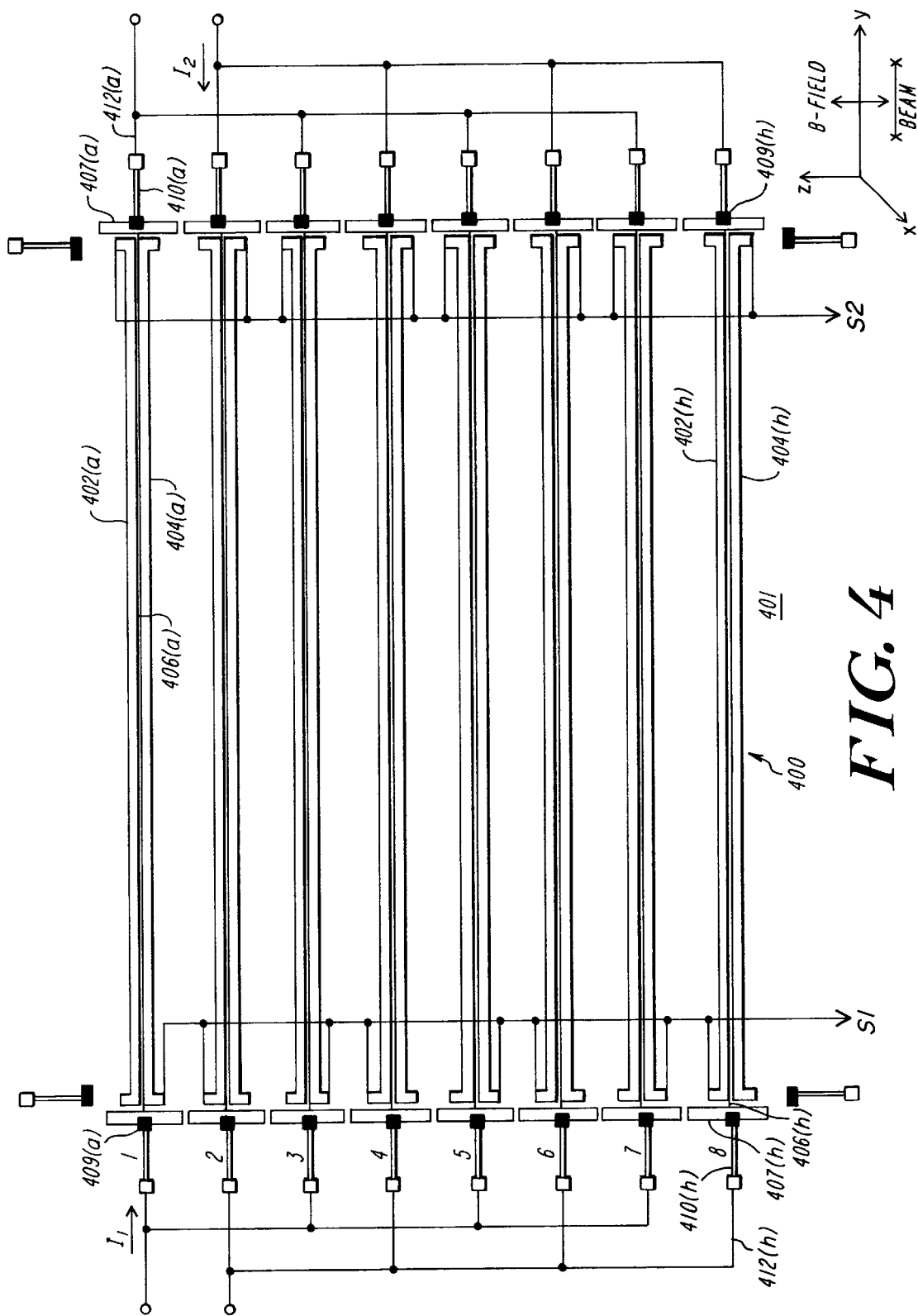
FIG. 4 is top schematic view of an embodiment of a magnetic sensor which senses a B field in the z axis, where the circuit substrate lies in the x–y plane.

FIG. 4 is top schematic view of an embodiment of a micromachined magnetic sensor 400 which senses a B field in the z axis, where the circuit substrate lies in the x–y plane. The sensor 400 includes a plurality of arrangements (similar to that of FIG. 3) of a moveable beam 406a–h positioned between two fixed beams 402a–h, 404a–h. The moveable beams 406 are conductively coupled to an underlying substrate 401 and associated circuitry via flexures 407a–h and anchors 409a–h. The anchors 409 are electrically connected to deposited n+ regions 410a–h which serve to conduct current to the moveable beams from signal lines 412a–h. As illustrated, alternating beam arrangements are provided with currents in opposite directions (I$_1$ and I$_2$) as described heretofore. The differential capacitances can be measured via contacts S1 and S2 which are connected to the fixed beams.

Figure 5A:
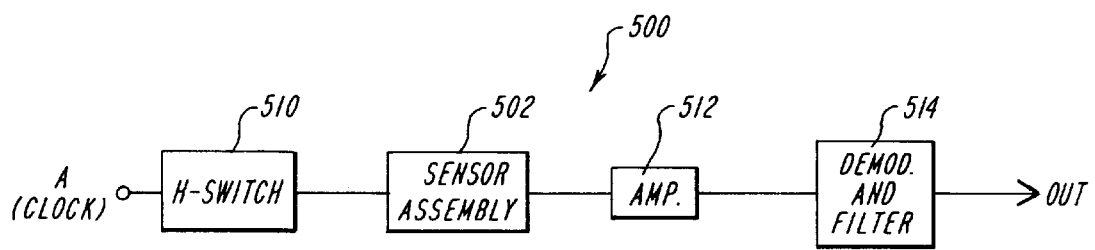
FIG. 5A is a block diagram of a magnetic sensor or magnetometer system in accordance with the invention.
Figure 5B:
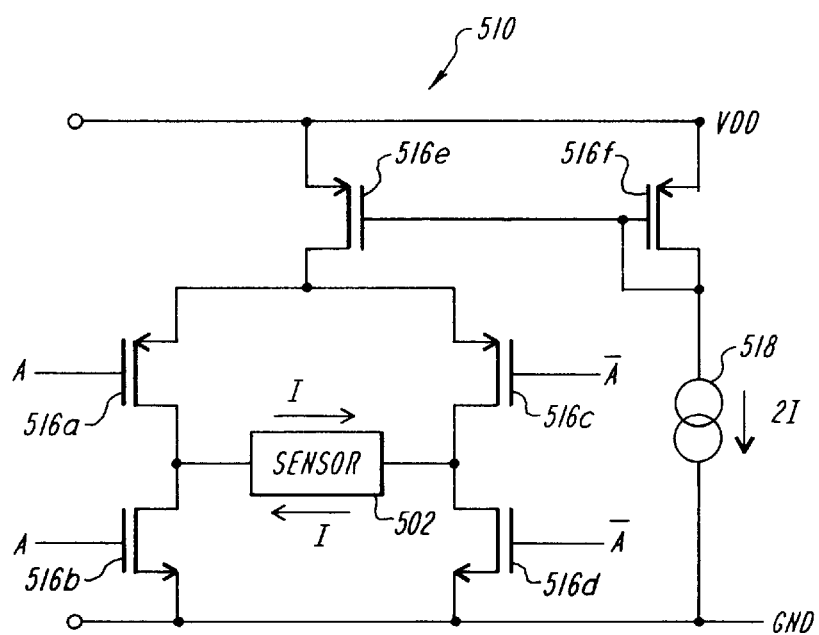
FIG. 5B is a schematic diagram of an H-switch which incorporates the sensor of FIG. 5A.

FIG. 5A is a block diagram of a magnetic sensor system 500 in accordance with the invention. FIG. 5B is a schematic diagram of an H-switch 510 which incorporates a sensor assembly 502. The sensor assembly 502 can be an arrangement of a moveable beam and fixed beams as shown in FIGS. 3 and 4. The H-switch 510 includes an arrangement of CMOS transistors 516a–f and a current source 518 of I which in response to receiving clocking signals A provides current in alternating directions to the sensor assembly 502. The fixed plates of the sensor assembly (e.g. S1 and S2 of FIG. 4) are connected to an amplifier 512. The amplifier serves to amplify the signals generated by the B field. The input elements of the amplifier may be fabricated in the substrate immediately beneath the sensor assembly with benefits of increased signal-to-noise ratio and reduced stray capacitance. The signals are then sent to a demodulator/filter module 514 in order to demodulate the output voltage of the amplifier and provide a DC output which is a function of the B field.

Assuming a sensor at 1000 Gauss FS (1000 Gauss=0.1 Tesla) with L=1,000 um and I=100 uA, the deflection is $X=1.22376 \times 10^{10} BIL^4$. Thus $X=1.22376 \times 10^{10} \times 0.1 \times 10^{-4} \times (10^{-3})^4$, which in turn equals 0.1224 µm or 1.224 Å per Gauss (peak) or 2.448 Å peak-to-peak. Assuming a similar sensor with L=500 um and I=100 uA, the deflection is $X=1.22376 \times 10^{10} 0.1 \times 10^{-4} \times (5 \times 10^{-4})^4$, or X=0.0076 µm peak or 0.152 Å per Gauss peak-to-peak. It will be understood that the FS deflection is 16 times worse when L is halved.

In the magnetic sensor as illustrated, the beam current can be reversed, hence getting a deflection in both directions for a given B field, thus doubling the observed output. This also allows for autozeroing out the initial physical beam offset. With a PS of 15 V, 300 uA can be applied to the beams instead of using 100 uA. Also, the signal is proportional to the drive voltage. If a large drive voltage can be used, the measured FS can be decreased.

In accordance with the well known "right hand rule", the direction of force F is orthogonal to the direction of current I and the magnetic field B. If the position of the beam and the direction of the flux density is known, the direction of the magnetomotive force F can be determined. In other words, with the right position of the beam, the direction of the magnetic flux is discernable. The z axis B field is easy to sense because the force F and the current I are in the same plane (x–y). The deflection will be inside the x–y plane. It is assumed that the x–y plane is the plane of the circuit die. However, when the B field is the x–y plane, the force F will be in the z axis and the deflection x is up or down (in the z axis). The differential capacitors have to be formed in the z axis.

Figure 6:
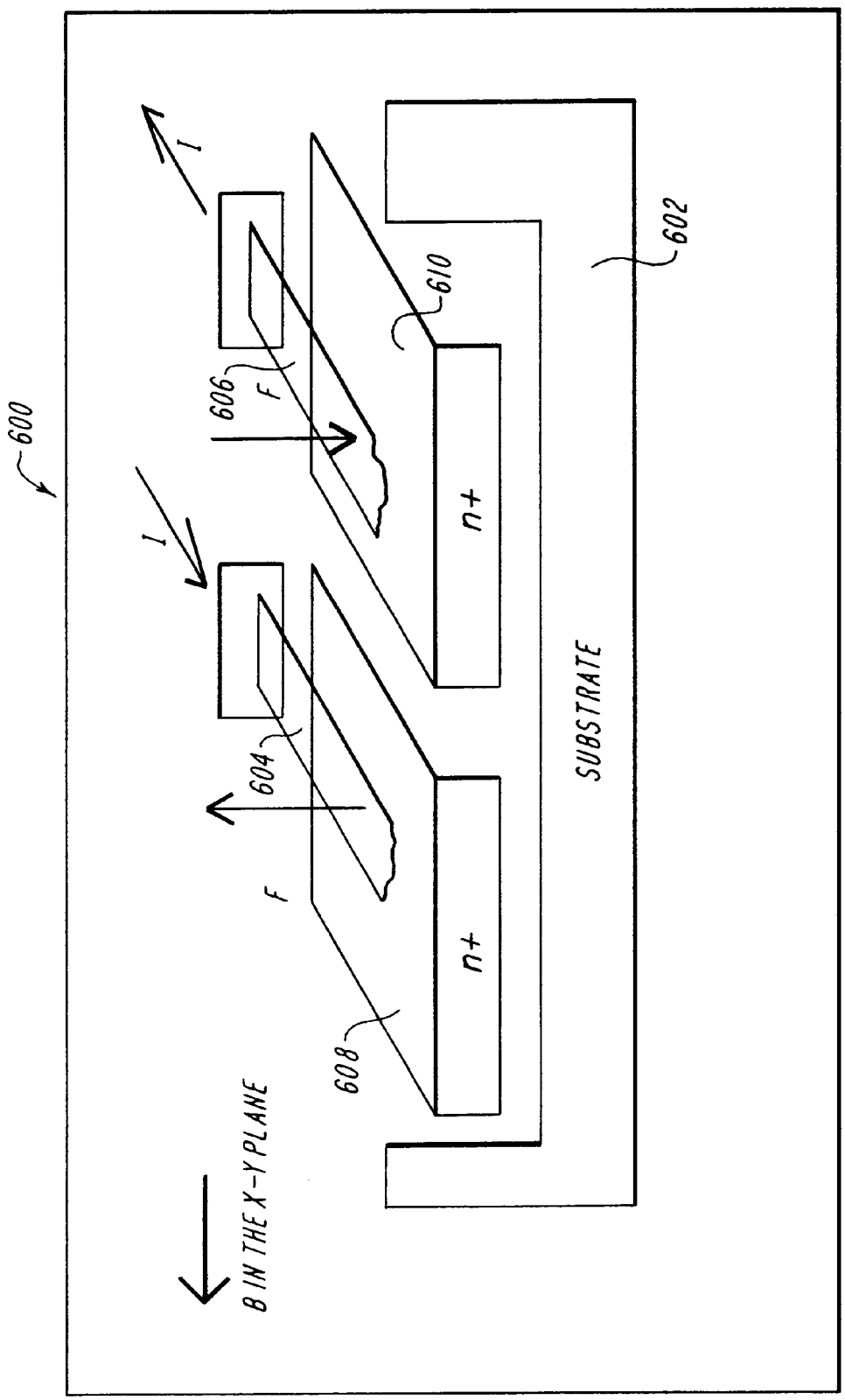
FIG. 6 is a diagrammatic perspective view of a magnetic sensor beam arrangement in accordance with the invention.

FIG. 6 is a diagrammatic perspective view of a micromachined magnetic sensor beam arrangement 600 in accordance with the invention. The arrangement 600 defines vertical differential capacitors to measure a B field in the x–y plane. The arrangement is micromachined on a semiconductor substrate 602, e.g. silicon, and includes first 606 and second 604 parallel moveable beams. The moveable beams are configured and conductively anchored to the substrate in a manner similar to that described with respect to FIGS. 2 and 3. Instead of the fixed beams of FIG. 2, the arrangement 600 utilizes fixed conductive members 608, 610 such as deposited n+ regions or other conducting materials that are isolated from the substrate, which run underneath the beam areas, as the fixed plates. Two identical currents I are forced in opposite directions in each of the moveable beams in order to increase the differential capacitance and cancel out any acceleration forces. Accordingly, in response to a B field in the x–y plane, a magnetomotive force F is generated in the beams in the z axis.

In the situation where the B field to be sensed is in the x axis, the beams are positioned in the y axis. If the B field is in the y axis, the sensor beam arrangement will be in the x axis. In an alternative embodiment of the invention, a combination of beam arrangements as in FIGS. 3 and 6 (one for each axis), a 3-D magnetic sensor can be achieved.

Figure 7:
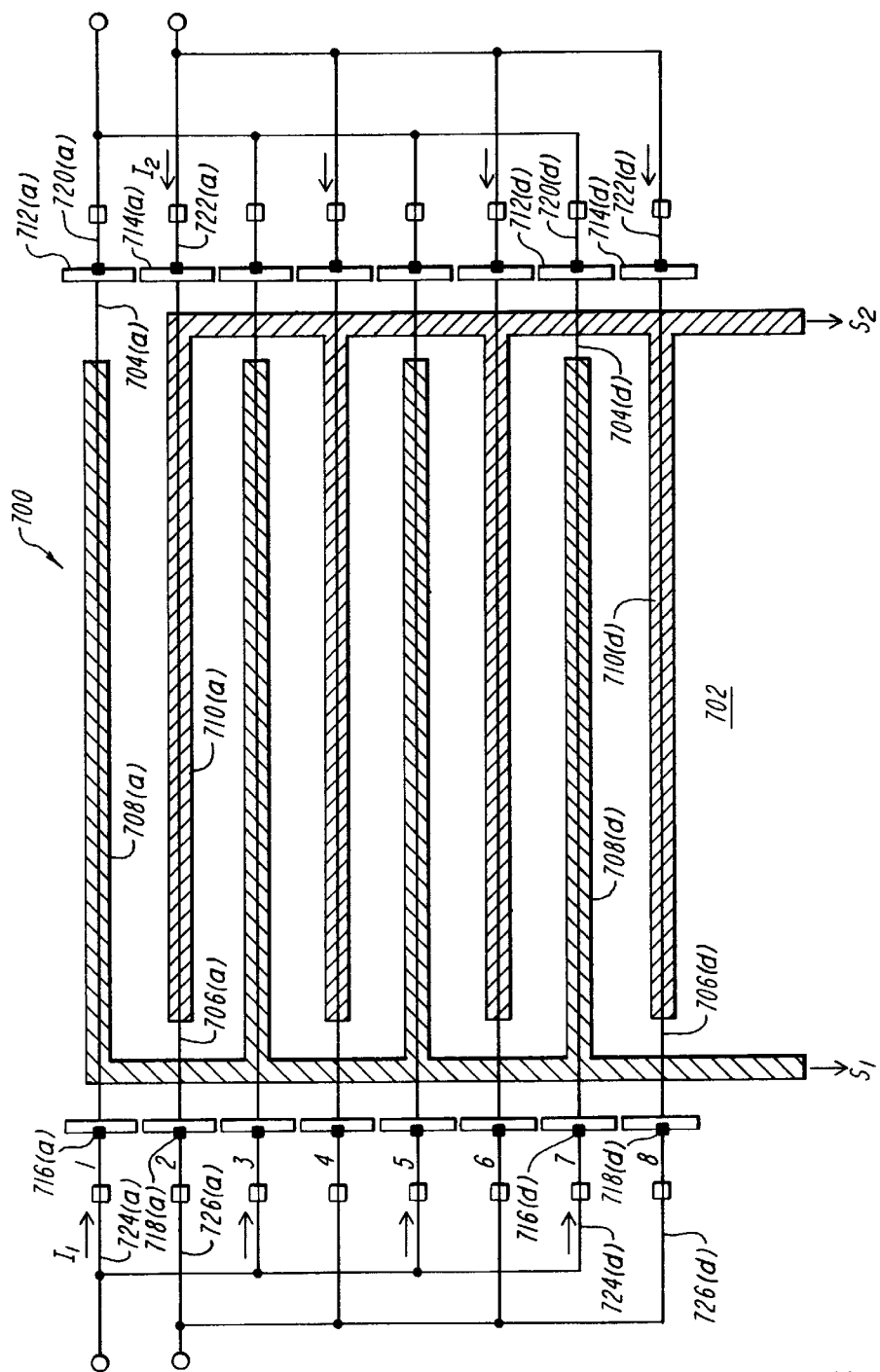
FIG. 7 is top schematic view of an embodiment of a magnetic sensor which senses a B field in the y or x axis, where the circuit substrate lies in the x–y plane.
Figure 8:
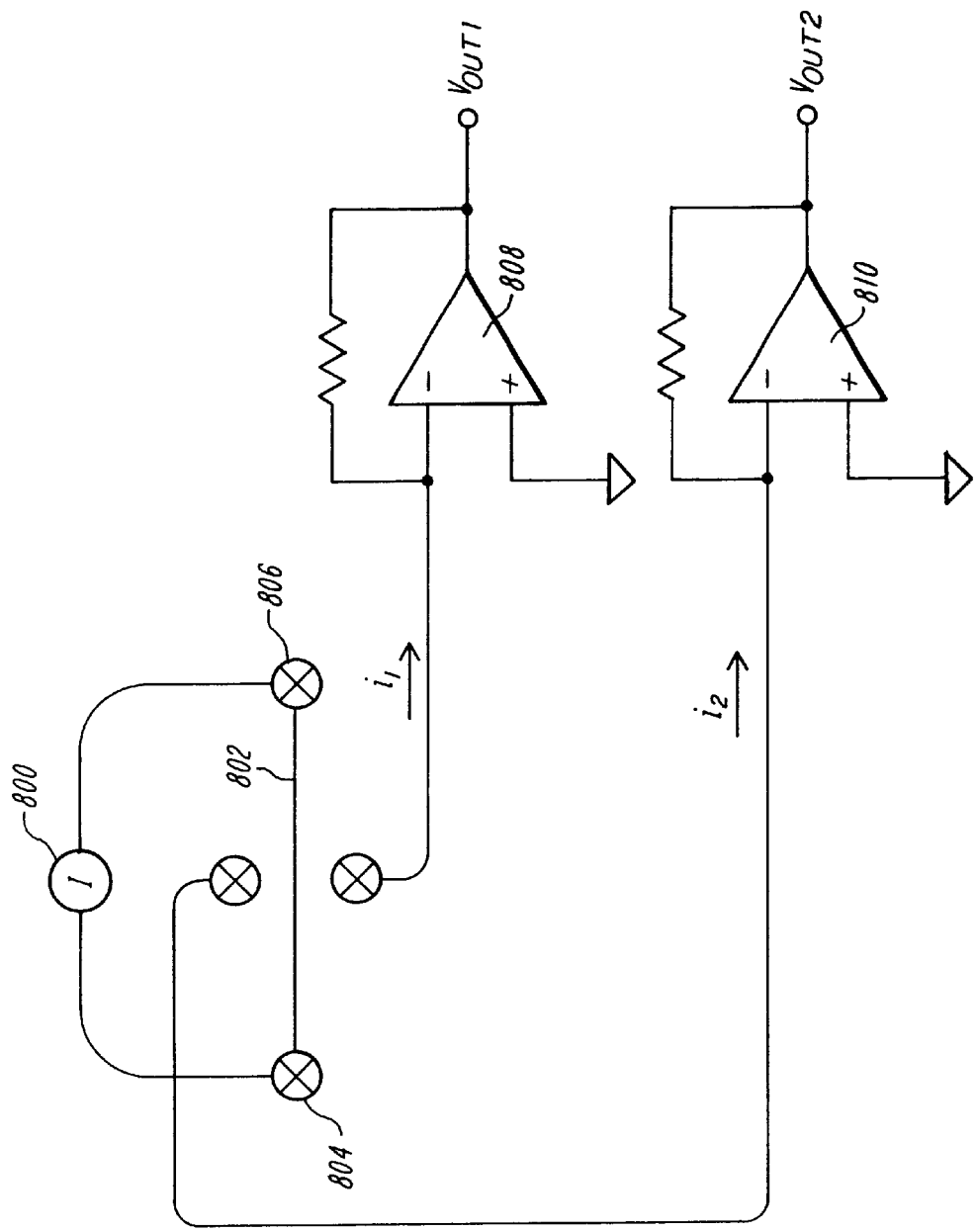
FIG. 8 is a schematic block diagram of a system technique for measuring magnetic fields utilizing a tunnel current measurement in accordance with the invention.

FIG. 7 is top schematic view of an embodiment of a micromachined magnetic sensor 700 which senses a B field in the y or x axis, where the circuit substrate lies in the x–y plane. The sensor 700 includes a plurality of arrangements (similar to that of FIG. 6) of pairs of parallel moveable beams 704a–d, 706a–d positioned above respective sensing elements 708a–d, 710a–d, such as deposited n+ regions or other conducting materials that are isolated from the substrate, in an underlying circuit substrate 702. The moveable beams are conductively coupled to the underlying substrate and associated circuitry via flexures 712a–d, 714a–d and anchors 716a–d. The anchors 716,718 are electrically connected to deposited n+ regions 720a–d, 722a–d which serve to conduct current to the moveable beams from signal lines 724a–d, 726a–d. As illustrated, the alternating beam arrangements are provided with currents in opposite directions ($I_1$ and $I_2$) as described heretofore. The differential capacitances can be measured via contacts S1 and S2 which are connected to the n+ regions 708, 710. In an embodiment where the sensing elements are the conductive materials other than diffusions, amplifier input components can be fabricated in the substrate beneath the sensing elements With reference now to FIG. 8, a system technique for measuring magnetic field utilizing a tunnel current measurement in accordance with the invention is described. A DC current source 800 provides a current I to a movable beam 802. The moveable beam is configured as described with respect to FIGS. 2 and 3. First 804 and second 806 measuring anchors are positioned proximate to the center of the moveable beam.

When there is no B field applied, the beam 802 remains centered between the anchors, and there is no current induced at the anchors. When a B field is applied, the beam will deflect away from the center and approach one of the anchors. As the beam approaches one of the anchors, a tunnel current is induced therebetween. The tunnel current ($i_1$ or $i_2$) is measured by one of two amplifiers 808 or 810, in accordance with the equation $V_{out}=i*R$. The output voltages will indicate the sign of the B field. The tunnel current represents a portion of the total current I.

Figures 9A, 9B:
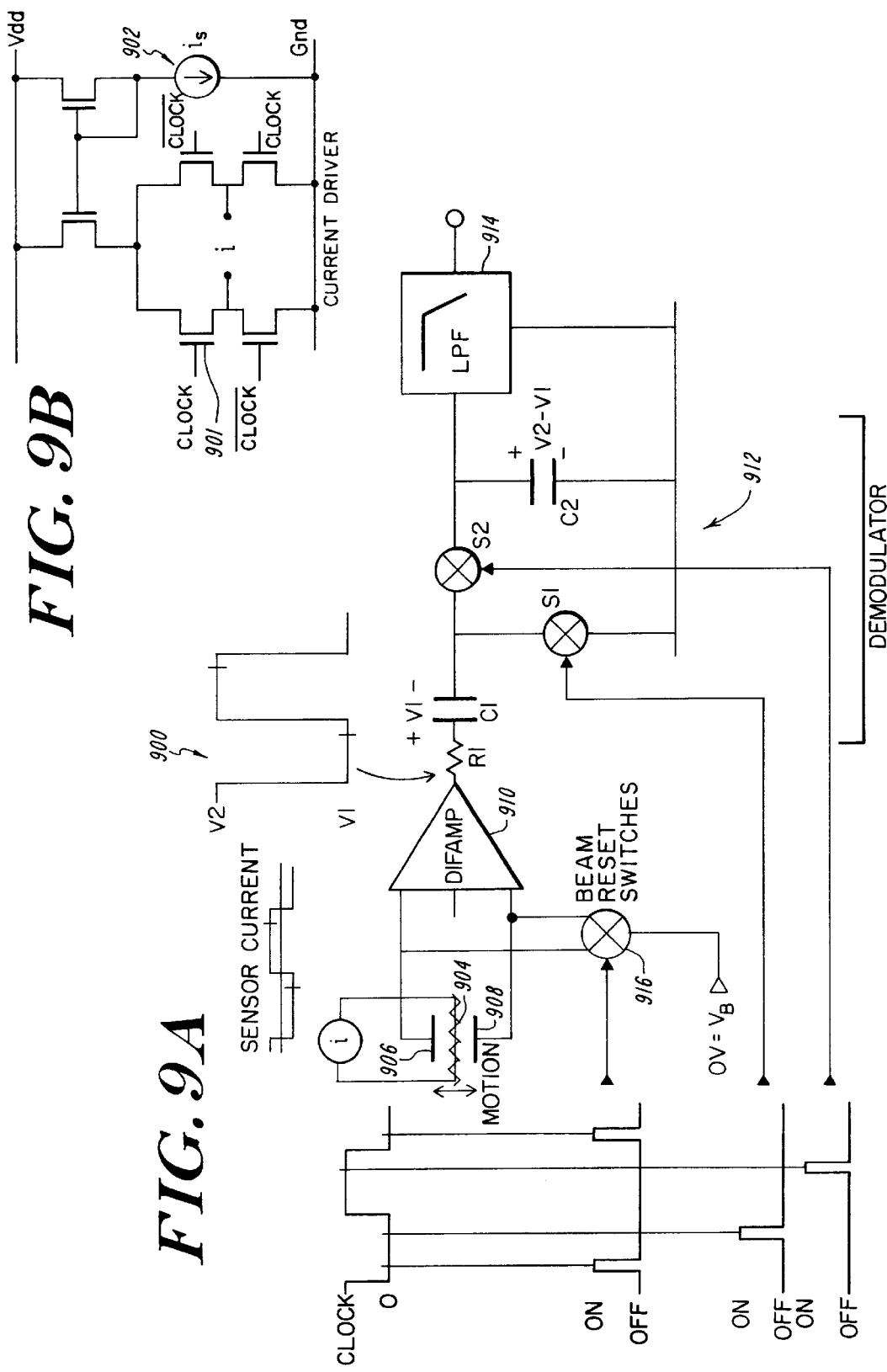
FIG. 9A is a schematic diagram of a sensor circuit in accordance with the invention.
FIG. 9B is a schematic diagram of a current driver for use in the circuit of FIG. 9A.

FIG. 9A is a schematic of a sensor circuit 900. FIG. 9B is a schematic diagram of a current driver for use in the circuit of FIG. 9A. A clock signal is applied to the clock input 901 of an H-switch current driver 902. The current is applied to a moveable beam 904 positioned between fixed beams 906 and 908. The moveable beam serves as an inner plate of a pair of variable capacitors formed by the moveable beam and fixed beams.

If there is no B field present, the inner plate or moveable beam is centered, thus the variable capacitors are equal. Therefore, the output signal is zero. When a B field is applied, the moveable beam is deflected from center. The amplitude of the AC output at the variable capacitors are related to the magnitude of the moveable beam's deflection, and the phase of the output indicates the direction of displacement.

A differential amplifier 910 modifies the signal from the beams to a desired size. A demodulator 912 translates the carrier based signal to base band. An output lowpass filter 914 serves to filter the output voltage. Beam reset switches 916 maintain the DC potential of the fixed beams 906 and 908. The reset switches are turned on briefly once per cycle to maintain the common mode voltage of the two fixed beams. In the process, this establishes the level of one half cycle of the output waveform. The signal output of the sensor is then signed the other half cycle, measured with respect to this reference level.

Figure 10:
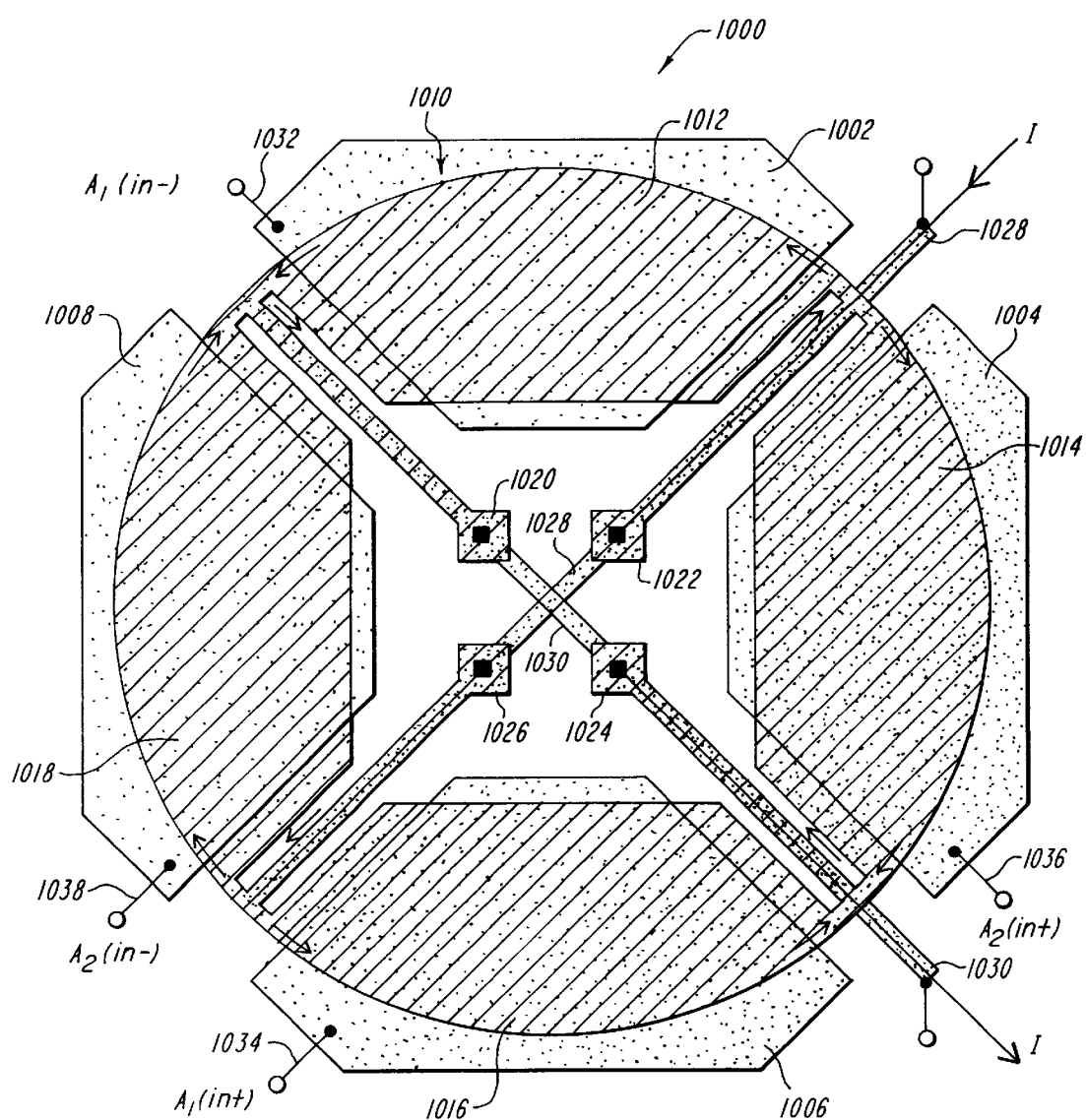
FIG. 10 is a top plan view of a magnetic sensor in accordance with the invention.

FIG. 10 is a top plan view of a magnetic sensor 1000 in accordance with the invention. The sensor 1000 senses the B field in the x or y direction (the plane of the die). The sensor is configured on a semiconductor substrate and includes four n+ doped regions 1002,1004,1006,1008 which serve as fixed plates. The fixed plates can also be any conducting materials that are isolated from the substrate. A micromachined plate 1010 is supported above the surface of the substrate by anchors 1020,1022,1024,1026. The plate 1010 includes four moveable plates 1012,1014,1016,1018, each which is positioned directly over a respective fixed plate. The fixed and moveable plates define four variable capacitors which vary in capacitance in response to deflections of the moveable plates in the presence of B fields. Measurement current is provided to the moveable plates via a n+ doped runner 1028 and anchors 1022 and 1026, and current is carried out via anchors 1020 and 1024 and a n+ runner 1030 in the substrate. The fixed n+ regions 1002 and 1006 are coupled to a first amplifier (not shown) via contacts 1032 and 1034, respectively,, and the n+ regions 1004 and 1008 are coupled to a second amplifier (not shown) via contacts 1036 and 1038, respectively, in order to sense the signal which is created by the presence of a B field.

The foregoing description has been set forth to illustrate the invention and is not intended to be limiting. Since modifications of the described embodiments incorporating the spirit and substance of the invention may occur to persons skilled in the art, the scope of the invention should be limited solely with reference to the appended claims and equivalents thereof.

What is claimed is:

1. (Amended) A device comprising:

a semiconductor substrate;

at least one micromachined beam suspended above said semiconductor substrate through which a current is passed, said beam being deflected perpendicularly with respect to an applied magnetic field; and at least one first and second fixed conductive members for sensing, the deflection of said beam, said fixed conductive members comprising conductive members adjacent said beam, said beam and conductive members defining variable capacitors therebetween, wherein said at least one first fixed conductive member is positioned underneath said beam and said at least one second fixed conductive member is supported above said semiconductor substrate in order to sense magnetic fields which are both perpendicular to and in the plane of said substrate.

2. The device of claim 1, wherein said at least one first fixed conductive member comprises a doped region of said semiconductor substrate positioned underneath said beam.

3. The device of claim 2, wherein said at least one first fixed conductive member comprises a conducting material that is isolated from said semiconductor substrate positioned underneath said beam.

4. The device of claim 1, wherein said at least one second fixed conductive member comprises at least one fixed beam supported above said semiconductor substrate and arranged so as to be spaced apart along its length from said beam.

5. The device of claim 1, wherein said at least one second fixed conductive member comprises at least one fixed beam supported above said semiconductor substrate and arranged in parallel to said beam.

6. A magnetic field sensor comprising:

a semiconductor substrate:

a micromachined moveable conductive member suspended above the surface of said semiconductor substrate through which a current is passed, said moveable conductive member being deflected perpendicularly with respect to an applied magnetic field; and at least one first and second fixed conductive members arranged adjacent to said moveable conductive member, said moveable member deflecting to or away from said first and second fixed conductive members and defining variable capacitors therebetween, wherein said at least one first fixed conductive member is positioned underneath said beam and said at least one second fixed conductive member is supported above said semiconductor substrate in order to sense magnetic fields which are both perpendicular to and in the plane of said substrate.

7. The sensor of claim 6, wherein said moveable conductive member comprises a micromachined moveable beam suspended above the surface of said semiconductor substrate.

8. The device of claim 7, wherein said at least one second fixed member comprises at least one fixed beam supported above said semiconductor substrate and arranged in parallel to said moveable conductive beam.

9. The device of claim 6, wherein said at least one first fixed member comprises at least one doped region of said semiconductor substrate positioned underneath said moveable conductive member.

10. The device of claim 6, wherein said at least one first fixed member comprises a conducting material that is isolated from said semiconductor substrate positioned underneath said moveable conductive member.

11. The device of claim 7, wherein said moveable conductive member comprises a micromachined moveable plate suspended above a surface of said semiconductor substrate.

12. The device of claim 11, wherein said plate comprises a plurality of sections each of which is positioned above a corresponding one of said at least one first fixed conductive member.

13. A semiconductor magnetic field sensor comprising:

a substrate;

a moveable semiconductor element suspended above the surface of said substrate, said moveable element being configured to have a current passed therethrough and to deflect perpendicularly with respect to an applied magnetic field; and at least one first and second fixed semiconductor elements arranged adjacent to said moveable element, said moveable element being deflected to or away from said first and second fixed elements in response to an applied magnetic field and defining variable capacitors therebetween, wherein said at least one first fixed semiconductor element is positioned underneath said beam and said at least one second fixed semiconductor element is supported above said substrate in order to sense magnetic fields which are both perpendicular to and in the plane of said substrate.

14. The sensor of claim 13, wherein said moveable semiconductor element comprises a micromachined moveable beam suspended above said substrate.

15. The device of claim 14, wherein said at least one second fixed element comprises at least one fixed beam supported above said substrate and arranged in parallel to said moveable beam.

16. The device of claim 13, wherein said at least one first fixed element comprises at least one doped region of said substrate positioned underneath said moveable element.

17. The device of claim 13, wherein said at least one first fixed element comprises a conducting material that is isolated from said substrate.

18. The device of claim 17, wherein active circuitry is formed underneath said at least one first fixed element.

19. The device of claim 16, wherein said moveable semiconductor element comprises a micromachined moveable plate suspended above said substrate.

20. The device of claim 19, wherein said moveable plate comprises a plurality of sections each of which is positioned above a corresponding one of said at least one doped region.

21. A semiconductor magnetic field sensor comprising:

a substrate;

first and second semiconductor moveable beams suspended above the surface of said substrate, said first and second beams being configured to have equal and opposite currents passed therethrough and to deflect perpendicularly with respect to an applied magnetic field; and at least one first and second fixed semiconductor elements arranged adjacent to said first and second beams, respectively, said first and second beams being deflected to or away from said respective first and second fixed elements in response to an applied magnetic field and defining variable capacitors therebetween, wherein said at least one first fixed semiconductor element is positioned underneath said moveable beams and said at least one second fixed semiconductor element is supported above said substrate in order to sense magnetic fields which are both perpendicular to and in the plane of said substrate.

22. A device comprising:

a semiconductor substrate;

at least one micromachined beam suspended above said semiconductor substrate through which a current is passed, said beam being deflected perpendicularly with respect to an applied magnetic field; and at least one fixed conductive member for sensing the deflection of said beam, said beam and fixed conductive member defining a variable capacitor therebetween, wherein said at least one fixed conductive member is supported above said semiconductor substrate parallel to and in the plane of said beam in order to sense magnetic fields which are perpendicular to the plane of said substrate.

23. A magnetic field sensor comprising:

a semiconductor substrate;

a micromachined moveable conductive member suspended above the surface of said semiconductor substrate through which a current is passed, said moveable conductive member being deflected perpendicularly with respect to an applied magnetic field; and at least one fixed conductive member arranged adjacent to said moveable conductive member, said moveable member deflecting to or away from said fixed conductive member and defining a variable capacitor therebetween, wherein said at least one fixed conductive member is supported above said semiconductor substrate, parallel to and in the plane of said beam, in order to sense magnetic fields which are perpendicular to the plane of said substrate.

24. A semiconductor magnetic field sensor comprising:

a substrate;

a moveable semiconductor element suspended above the surface of said substrate, said moveable element being configured to have a current passed therethrough and to deflect perpendicularly with respect to an applied magnetic field; and at least one fixed semiconductor element arranged adjacent to said moveable element, said moveable element being deflected to or away from said fixed element in response to an applied magnetic field and defining a variable capacitor therebetween, wherein said at least one fixed semiconductor element is supported above said substrate, parallel to and in the plane of said moveable element, in order to sense magnetic fields which are perpendicular to the plane of said substrate.

* * * * *